United States Patent
Vaufrey

(10) Patent No.: US 9,640,722 B2
(45) Date of Patent: May 2, 2017

(54) SEMICONDUCTOR STRUCTURE AND METHOD FOR MANUFACTURING A SEMICONDUCTOR STRUCTURE

(71) Applicant: Commissariat a l'energie atomique et aux energies alternatives, Paris (FR)

(72) Inventor: David Vaufrey, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/762,660

(22) PCT Filed: Jan. 21, 2014

(86) PCT No.: PCT/EP2014/051067
§ 371 (c)(1),
(2) Date: Jul. 22, 2015

(87) PCT Pub. No.: WO2014/114606
PCT Pub. Date: Jul. 31, 2014

(65) Prior Publication Data
US 2015/0364648 A1    Dec. 17, 2015

(30) Foreign Application Priority Data

Jan. 22, 2013    (FR) ...................................... 13 50540

(51) Int. Cl.
*H01L 29/06*    (2006.01)
*H01L 33/24*    (2010.01)
(Continued)

(52) U.S. Cl.
CPC .......... *H01L 33/24* (2013.01); *H01L 33/0025* (2013.01); *H01L 33/0075* (2013.01);
(Continued)

(58) Field of Classification Search
CPC ......... H01L 2924/0002; H01L 51/5265; H01L 2251/5315; H01L 2924/00; H01L 51/5016;
(Continued)

(56) References Cited

U.S. PATENT DOCUMENTS

2006/0261367 A1    11/2006  Lee et al.
2007/0215882 A1     9/2007  Son
(Continued)

FOREIGN PATENT DOCUMENTS

EP    2 375 458 A2    10/2011

OTHER PUBLICATIONS

U.S. Appl. No. 14/704,407, filed May 5, 2015, Bialic et al.
French Preliminary Search Report issued Oct. 16, 2013 in Patent Application No. 1350540 (with English translation of categories of cited documents).
International Search Report issued Aug. 11, 2014 in PCT/EP2014/051067 (with partial English language translation).
(Continued)

*Primary Examiner* — Robert Bachner
(74) *Attorney, Agent, or Firm* — Oblon, McClelland, Maier & Neustadt, L.L.P.

(57) ABSTRACT

A semiconducting structure configured to emit electromagnetic radiation. The structure includes a first zone and a second zone with first and second types of conductivities respectively opposite to each other, the first and second zones being connected to each other to form a semiconducting junction. The first zone includes at least a first and a second part, the first and the second parts being separated from each other by an intermediate layer, as a spreading layer, extending approximately parallel to a junction plane along a major part of the junction. The spreading layer can cause spreading of carriers in the plane of the spreading layer.

17 Claims, 4 Drawing Sheets

(51) Int. Cl.
*H01L 33/08* (2010.01)
*H01L 33/14* (2010.01)
*H01L 33/00* (2010.01)
*H01L 33/06* (2010.01)

(52) U.S. Cl.
CPC .............. *H01L 33/06* (2013.01); *H01L 33/08* (2013.01); *H01L 33/14* (2013.01); *H01L 33/145* (2013.01); *H01L 2924/0002* (2013.01)

(58) Field of Classification Search
CPC .............. H01L 51/5203; H01L 51/524; H01L 51/5246; H01L 51/5253; H01L 51/56; H01L 33/08; H01L 51/002; H01L 51/5052

See application file for complete search history.

(56) References Cited

U.S. PATENT DOCUMENTS

| | | | |
|---|---|---|---|
| 2011/0244616 A1* | 10/2011 | Yu | H01L 33/145 438/45 |
| 2011/0248238 A1 | 10/2011 | Yoon et al. | |
| 2011/0272719 A1 | 11/2011 | Chen et al. | |
| 2013/0221385 A1 | 8/2013 | Shibata et al. | |
| 2014/0120702 A1 | 5/2014 | Vaufrey et al. | |

OTHER PUBLICATIONS

Christopher Kölper, et al., "Core-shell InGaN nanorod light emitting diodes: Electronic and optical device properties" Physica Status Solidi (A) Applications and Materials Science, vol. 209, No. 11, XP002722041, 2012, pp. 2304-2312.

* cited by examiner

SEMICONDUCTOR STRUCTURE AND METHOD FOR MANUFACTURING A SEMICONDUCTOR STRUCTURE

TECHNICAL FIELD

The invention relates to the field of light emission and devices adapted for such light emission.

There has been a strong trend over the last twenty years towards minimising energy consumption of electrical devices. Devices adapted to emit light have not escaped from this trend.

Thus, light sources for these devices have changed in turn from incandescent light sources to fluorescent tubes and recently to semiconducting structures.

Although such a structure provides a significant saving in consumption compared with a fluorescent tube, optimisation of energy efficiency is still a current problem.

The invention more particularly concerns a semiconducting structure and the method of manufacturing such a structure.

STATE OF PRIOR ART

Semiconducting structures adapted to emit the light are usually Light Emitting Diode structures known under the abbreviation LED. Such a structure comprises a first semiconducting zone and a second semiconducting zone with a first and second type of conductivity respectively opposite to each other, the first and the second zones being connected to each other so as to form a semiconducting junction.

According to one usual configuration of a vertical diode (better known under the term " Vertical Thin Film Diode" (VTF LED), such a structure has a first face from which light is emitted, the second face opposite the first face having a reflecting layer adapted to reflect some of the light that is not emitted towards the emitting face. In such a configuration, the first zone comprises the first face and the second zone comprises the second face.

In order to polarise the structure, each zone comprises an electrical contact, the electrical contact in the second zone forming the reflecting layer. In this configuration, the electrical contact of the first zone occupies a relatively small area of the first face in order to allow light emitted by the junction to pass through.

Thus, electrical contacts polarise the junction in which photons are generated.

Although such a structure emits light with high energy efficiency compared with fluorescent tube light sources, it does have a number of disadvantages.

Due to its design and the low conductivity of the materials in which the first and second semiconducting zones are formed (compared with the conductivity of electrical contacts), the current and therefore the carriers circulate mainly in a volume of the first and second semiconducting zones defined by projection lines orthogonal to the contact of the first zone on the contact of the second zone, this volume being called the conduction volume. Therefore, light emission takes place mainly in the part of the junction contained within this conduction volume.

In fact, the current spreading in the light emitting diode junction is low because the current density is maximum in the conduction volume and decreases quickly in parts of the junction adjacent to said volume.

The result is two disadvantages that are firstly that a major part of the junction does not contribute to light emission because no current passes through it, and secondly since emission takes place mainly between the two electrical contacts, a large proportion of the emitted light is trapped in an optical cavity formed by the two non-transparent electrical contacts.

It is known that these disadvantages can be overcome by providing a carrier blocking system in the first zone extending only facing the electrical contact of the first zone. Such a blocking system formed by inserting a semiconducting zone with a larger gap than the gap of the semiconductor forming the first zone, can create an energy barrier. This energy barrier obliges electrical carriers to bypass it to reach the junction. In other words, the carriers are diverted towards parts of the junction not included in the previously described conduction volume.

Thus, with such a deviation of the carrier current around the periphery of the region forming the blocking system, light emission takes place in the junction over a larger part than that contained in the conduction volume. Therefore the result is an increase in the emission efficiency of the junction and therefore the structure, the emission area being larger and the proportion of radiation trapped by the electrical contacts being smaller.

Nevertheless, setting up such a blocking system during fabrication of a semiconducting structure requires a large number of additional manufacturing steps that introduces a non-negligible increase in the manufacturing cost in comparison with a structure without such a blocking system, hardly compatible with general public applications. In particular, the structuring step of the blocking system requires an output and then a return in the growth frame of semiconducting zones, so that the blocking system only extends on parts of the first zone facing the first electrical contact.

Furthermore, such a blocking system is optimised mainly for low polarisation voltages of the structure. The current is no longer entirely deviated for polarisation voltages higher than the height of the barrier induced by the blocking system, and a non-negligible proportion of light is emitted in the region between the two electrical contacts. Therefore, a structure with such a system is not optimised for applications requiring strong light emission.

It is also known that the disadvantages of a structure without a blocking system can be overcome by inserting a transparent electrode between the electrical contact of the first zone and the first zone. Such a transparent electrode, usually made from indium-tin oxide (ITO), extends along the emitting face.

Thus, with such an electrode, polarisation is applied over the entire structure and the carrier current is distributed uniformly in the structure. The result is that light emission takes place over most of the junction and only small proportion of light radiation is trapped between the electrical contacts of the first and second zones, the remainder of the radiation passing through the transparent electrode.

Although a structure comprising such a transparent electrode can emit light over the entire area of the junction, it nevertheless has the disadvantage that such an electrode, in addition to absorbing some of the emitted light, has a lower conductivity than the metallic contact. This reduction in conductivity creates electrical losses that, with absorption of light by the electrode, reduce the energy efficiency of such a structure. Furthermore, the use of such an electrode requires expensive surface treatments in order to obtain a resistive electrical contact with the semiconducting material forming the first zone, which drastically increase the manufacturing costs of a structure with such an electrode in comparison with a structure without such an electrode. It is also known that the disadvantages mentioned above can be overcome by considerably increasing the thickness of the first semiconducting zone.

An increase in the thickness of the first zone allows a current circulating in the light emitting diode to spread.

Although this technological solution is very easy to implement, it has the significant disadvantage that firstly it increases the formation time of the light emitting diode, and secondly consumes more semiconducting materials. Many of these semiconducting materials are available in limited quantities on earth and are therefore expensive. This is particularly the case of gallium.

PRESENTATION OF THE INVENTION

This invention is aimed at overcoming these disadvantages.

One purpose of the invention is to provide a semiconducting structure adapted to emit light, with an energy efficiency optimised in comparison with prior art and that can be obtained without a significant additional manufacturing cost related to the means of achieving such an optimisation of the efficiency.

To achieve this, the invention relates to a semiconducting structure adapted to emit electromagnetic radiation, said structure comprising:
  a first and a second zone with a first and a second type of conductivity respectively opposite to each other, said first and second zones being connected to each other to form a semiconducting junction, said junction extending along a plane called the junction plane,
  the first zone comprising at least a first and a second part, such that the second part is the part of the first zone through which the first zone is connected to the second zone,
  the first part and the second part being separated from each other by an intermediate layer called the spreading layer, extending approximately parallel to the junction plane along a major part of the junction, said spreading layer being adapted to cause spreading of carriers along directions included in the plane of the spreading layer.

Such a spreading layer means that carriers can be spread along directions included in the plane of the spreading layer when the structure in which the layer is located is polarised. Thus, a more uniform current distribution in the junction is obtained in the second part of the first zone. Recombinations of electron-hole pairs and therefore light emission in the junction can therefore take place over the largest part of the junction. Therefore, the result is that light emission is distributed over most of the junction and only a small part of the radiation is absorbed by the contact of the first zone, unlike structures according to prior art without such a spreading layer.

Furthermore, such a spreading layer in a multi-layer configuration can simply be made by temporarily modifying materials forming the first zone, during the formation step of the first zone. The result is that additional manufacturing costs of a structure comprising such a spreading layer may be not significant in comparison with the manufacturing costs of a structure without such a spreading layer.

Carrier spreading refers to the uniform redistribution of carriers in the plane of the spreading layer.

In the above and in the remainder of this document, "junction plane" refers to the plane along which the contact surface extends between two semiconducting zones with opposite conductivity, said junction plane possibly for example being plane or curved and/or having one or several angular portions. In the case in which two semiconducting zones are connected to each other through a third intrinsic or non-intentionally doped type semiconducting zone, the "junction plane" is the plane in which the space charge zone extends.

The first and second zones may be connected to each other by a third zone.

The third zone may comprise an intrinsic or a non-intentionally doped semiconductor, with an identical nature or a different nature from the first and second zones. The third zone may be formed from several parts.

The first and the second zones may be in physical contact with each other so as to form the junction and be directly connected to each other.

The spreading layer can extend along the entire junction.

Thus, the carriers may be distributed over the entire junction.

The spreading layer may have a higher resistivity than the first part of the first zone over its entire thickness.

Thus, the resistivity of the spreading layer becomes preponderant over the resistivity of the first part and advantageously over the resistivity of the second part. Therefore the resistance in the plane of the first part is negligible compared with the resistance to pass orthogonally through the spreading layer and therefore does not significantly increase the resistance perceived by a carrier moving away from the shortest path between the two electrical contacts. Therefore the result is good spreading of the carriers in the first zone along directions included in the plane of the spreading layer.

The spreading layer may be composed of a single semiconducting material.

In other words, the spreading layer may be made from a single material. A single material means that the relative proportion of elements forming the material is constant through the thickness of the layer and along the junction plane.

With such a spreading layer, spreading of the carriers in the first zone is increased without the crystalline purity of the spreading layer being degraded.

According to this possibility, the spreading layer forms a continuous layer since it is composed of a single material.

The spreading layer may include a uniform carrier concentration throughout its entire volume.

The spreading layer thus has a homogeneous concentration of majority carriers along the junction and does not have any preferred conducting path, so that the distribution of current lines during operation is uniform.

Advantageously, the material in the spreading layer is identical to the material forming the first and second parts of the first zone.

Thus, the first and the second parts of the first zone and the spreading layer may be made from the same material.

In the above, stating that the first and the second parts of the first zone and the spreading layer are made from the same material means that these two parts and the spreading layer are composed predominantly of elements with the same relative proportion, the proportion of doping elements (in other words supplying majority and/or minority carriers) possibly being different in this spreading layer and these two parts of the first zone. Thus, the first and the second parts of the first zone and the spreading layer may have a different resistivity, while having the same energy band gap.

In this way, spreading of carriers in the first zone is increased without the creation of structural defects induced by the difference in the mesh parameter as would be generated by a heterojunction.

The first part may be a layer approximately parallel to the junction plane, the first part of the first zone having a resistivity $\rho_1$ and a thickness $d_1$, the spreading layer having a resistivity $\rho_d$ and a thickness $d_d$ and the junction having a maximum dimension 2L in the junction plane, the thicknesses and resistivities of the first part of the first zone and the spreading layer respectively respecting the following relation:

$$\frac{\rho_1}{\rho_d} < 100 \frac{d_1 \times d_d}{L^2}.$$

Such a relation assures that the spreading of carriers actually takes place over the entire junction width, and particularly over a distance corresponding to half the maximum dimension L of the junction.

The resistivity of the spreading layer may be higher through its entire thickness than the resistivity of the first and second parts of the first zone.

According to this possibility and for a nominal operating temperature of the structure of $T_{nf}$, the spreading layer may have

- a conduction band with an energy level more than $kT_{nf}$ less than the energy level of the conduction band of the first part of the first zone if the conductivity type of the first zone is the type in which the majority carriers are electrons, or
- a valency band with an energy level more than $kT_{nf}$ more than the energy level of the valency band of the first part of the first zone if the conductivity type of the first zone is the type in which the majority carriers are holes.

In the above and throughout the remainder of this document, nominal operating temperature $T_{nf}$ of the structure refers to the maximum temperature for which the structure was designed to operate. Thus, for structures designed to operate at ambient temperature, the nominal operating temperature $T_{nf}$ will usually be fixed at 100° C. The spreading layer may be adapted to work with the first part of the first zone to form a potential drop for majority carriers of the first zone when these carriers pass from the first part of the first zone to the spreading layer.

In the above and throughout the remainder of this document, majority carriers of the first or the second zone refer to majority carriers corresponding to the conductivity type of the corresponding zone when the structure is not polarised. Thus, for example, if the first zone has a conductivity in which the majority carriers are obtained by means of electron donors, the majority carriers of the first zone are electrons. Conversely, if the first zone has a conductivity in which the majority carriers are obtained by means of electron acceptors, the majority carriers are holes.

Furthermore, throughout the remainder of this document, minority carriers of the first or the second zone refer to carriers of a type opposite to the type of majority carriers in the corresponding zone.

Thus, with such a drop in potential, when the majority carriers of the first zone pass through the interface between the first part and the spreading layer, some of their potential energy is converted into kinetic energy. This kinetic energy leads to spreading of majority carriers of the first zone that takes place particularly along directions within the plane of the spreading layer.

The spreading layer may also include

- a conduction band with an energy level higher than the energy level of the conduction band of the second part of the first zone with a value equal to at least $kT_{nf}$ if the type of conductivity of the first zone is the type in which the majority carriers are electrons, or
- a valency band with an energy level lower than the energy level of the valency band of the second part of the first zone with a value equal to at least $kT_{nf}$ if the type of conductivity of the first zone is the type in which the majority carriers are holes, where k in the above expression is Boltzmann's constant.

The spreading layer may be adapted to form a potential drop with the second part of the first zone, for majority carriers of the first zone when these carriers pass from the spreading layer to the second part.

Thus, with such a drop in potential, as the majority carriers of the first zone pass through the interface between the spreading layer and the second part of the first zone, part of their potential energy is converted into kinetic energy. This kinetic energy causes spreading of majority carriers in the first zone along directions within the plane of the spreading layer.

The spreading layer may also include:

- a conduction band with an energy level lower than the energy level of the conduction band of the second part of the first zone by a value equal to at least $kT_{nf}$ if the type of conductivity of the first zone is the type in which the majority carriers are electrons, or
- a valency band with an energy level higher than the energy level of the valency band of the second part of the first zone by a value equal to at least $kT_{nf}$ if the type of conductivity of the first zone is the type in which the majority carriers are holes.

According to the latter possibility, the second part of the first zone may have an energy band gap which is less than the energy band gap of the spreading layer.

Such a difference between the energy band gaps of the second part and the spreading layer may make it possible to avoid creating a potential barrier between the spreading layer and the second zone. This can limit losses during operation of the structure and therefore improve the energy efficiency of the structure.

The spreading layer may be adapted so that, with the second part, it forms a potential barrier for majority carriers of the first zone when the majority carriers of the first zone pass from the spreading layer to the second part.

With such a potential barrier, the interface resistance between the spreading layer and the second part of the first zone is increased for majority carriers of the first zone when they pass from the spreading layer to the second part of the first zone. Thus, the resistance for majority carriers along the spreading layer is therefore negligible relative to the interface energy barrier between the spreading layer and the second part of the first zone and therefore do not significantly increase the resistance perceived by a carrier at a distance from the shortest path between the electrical contacts of the first zone and the second zone.

The spreading layer may include:

- a conduction band with an energy level higher than the energy level of the conduction band of the second part of the first zone by a value less than $kT_{nf}$ if the type of conductivity of the first zone is the type in which the majority carriers are electrons, or
- a valency band with an energy level lower than the energy level of the valency band of the second zone by a value less than $kT_{nf}$ if the type of conductivity of the first zone is the type in which the majority carriers are holes.

According to the latter possibility, the energy band gap of the second part of the first zone may be greater than the energy band gap of the spreading layer.

The spreading layer may form a potential well for majority carriers of the first zone, between the first part and the second part of the first zone.

Thus, majority carriers of the first zone passing through the interface between the first part and the spreading layer lose some of their potential energy that is converted into kinetic energy and are partially confined in the spreading layer due to the potential barrier present at the interface between the spreading layer and the second part of the first zone. Therefore, due to their kinetic energy and partial confinement in the spreading layer, majority carriers of the first zone can spread along directions within the plane of the spreading layer. The first zone may be formed of at least three chemical elements of which the proportion of at least one of said elements can vary the energy band gap of a semiconducting material formed from said elements, the spreading layer having an average proportion of at least one of the elements different from the average proportion of at least the first part of the first zone such that the energy band gap of the spreading layer is less than the energy band gap of the first part.

Such chemical elements make it possible to modify the energy band gap as a function of the required energy band gap values, by varying the proportion of at least one of these elements during the step in which the first zone is being produced during manufacturing of the structure. The result obtained is thus a structure according to the invention in which manufacturing costs are equal to the same order of magnitude as a structure according to prior art.

The first zone may be formed from at least three chemical elements selected from the group including indium (In), gallium (Ga), aluminium (Al), nitrogen (N) and a chemical electron donor or acceptor element for semiconductors formed by said chemical elements.

The structure may be a planar type structure, in other words the shape of the junction plane may be approximately plane.

Such a structure has an emission surface extending over a major part of the surface occupied by the structure.

The structure may be a semiconducting wire with a core-shell type configuration, the junction plane being approximately in the form of an envelope separating an elongated wire core and a shell surrounding the wire core over at least part of its height.

The junction plane may be approximately tubular or cylindrical in shape.

With such a shell core type configuration, the emission surface of the structure is particularly optimised relative to its volume, and the structure is therefore particularly suitable for applications such as lighting requiring strong light emissions.

The structure may be a semiconducting wire with a core-shell type configuration, the junction plane being approximately in the form of an envelope separating an elongated wire core and a shell surrounding the wire core at one of its ends and over part of its height.

The structure may be a semiconducting wire with a core-shell type configuration, the junction plane being approximately in the form of an envelope separating an elongated wire core and a shell surrounding the wire core only over part of its height.

The wire core may form the first part of the first zone and the spreading layer, and the shape of the second part of the first zone, the third zone and the second zone may be a shell in a nested type configuration. The invention also relates to a semiconducting component comprising a plurality of semiconducting wires, each adapted to emit electromagnetic radiation, at least two semiconducting wires being wires according to the invention.

Such a component has uniform emission between the wires, at least for the wires according to the invention.

The semiconducting wires may be connected in parallel.

Such a connection of the semiconducting wires in parallel allows the component to have a well distributed emission between each of the wires, for the wires according to the invention. With a spreading layer according to the invention, the semiconducting wires according to the invention have a relatively uniform impedance compared with conventional semiconducting wires for which the impedance depends particularly on fluctuations in the manufacturing process. Therefore in such a component, since the impedance of the semiconducting wires is uniform, the resulting current and light emission are distributed uniformly between the semiconducting wires.

The semiconducting wires may be connected independently of each other.

With such an independent connection of wires, the emission from the semiconducting wires according to the invention is relatively uniform for a given polarisation because due to the spreading layer, they have a relatively uniform impedance compared with conventional semiconducting wires for which the impedance depends particularly on fluctuations in the manufacturing process.

The invention also relates to a method of manufacturing a semiconducting structure comprising the following steps:
  form the first part of the first zone,
  form the spreading layer in contact with the first part on one of its two faces,
  form the second part of the first zone in contact with the spreading layer on the face of the spreading layer opposite the first part of the first zone,
  form the second zone of the structure, the second zone of the structure being connected to the first zone.

Such a method can be used to produce a structure according to the invention.

During the step in which the spreading layer is formed, the spreading layer may be composed of a single semiconducting material and its resistivity may be higher than the resistivity of the first part of the first zone.

During the step in which the second part of the first zone is formed, the resistivity of the second part of the first zone may be less than the resistivity of the spreading layer.

The first zone may be a multi-layer with a first and a second layer forming the first and the second parts respectively, each of the steps to form the first and the second parts being a step in which a semiconducting material is formed in order to form a layer of said material.

The steps in which the first and second parts and the spreading layer are formed may be done in a single step consisting of depositing a semiconducting material comprising at least one type of doping elements adapted to produce at least one carrier corresponding to the first type of conductivity, the concentration of at least one of the doping elements being varied during the deposit so as to form the spreading layer.

The first part and the second part of the first zone and the spreading layer may be formed from semiconducting materials with a different energy band gap for at least the first part and the spreading layer, the steps to form the first and second parts and the spreading layer taking place in a single step consisting of depositing chemical elements forming a semiconducting material, the composition of which is varied during the deposition so as to form the second part, the spreading layer and the first part in sequence.

Such methods can be used to supply structures according to the invention without significant extra costs compared with a structure according to prior art, the layers forming the first zone being produced in a single step.

The step in which the first part of the first zone is formed may be a step to produce a wire core, the steps to form the spreading layer, the second part and the second zone being steps to form layers each of which has an approximately shell shape.

Such a step is particularly suitable for the supply of a structure consisting of a semiconducting wire.

The invention also relates to a method for manufacturing a semiconducting component comprising the parallel use of each of the manufacturing steps of a structure according to the invention so as to form a plurality of structures.

Such a method can be used to fabricate a component in which each of its structures benefits from the advantage of a structure according to the invention, and which also has more uniform emission from the structures used in it, the impedance of these structures being more uniform than is possible with this type of structure without a spreading layer, due to the benefit of the spreading layer.

BRIEF DESCRIPTION OF THE DRAWINGS

This invention will be better understood after reading the description of example embodiments given purely for information and in no way limitative, with reference to the appended drawings in which.

Identical, similar or equivalent parts of the different figures have the same numeric references to facilitate comparison between the different figures.

The different parts shown in the figures are not necessarily all shown at the same scale, to make the figures more easily understandable.

The different possibilities and variants of the invention should be understood as not being exclusive of each other and may be combined together.

DETAILED PRESENTATION OF PARTICULAR EMBODIMENTS

The structures according to the invention described below are example embodiments of the invention given for the purpose of illustrating the possibilities of the invention and therefore they are not limitative of possible applications of the invention. Similarly, when values are mentioned below, these values correspond to a particular application of the invention. Therefore these values should not be understood as being limitative values of the invention and are therefore only given as examples.

First Embodiment

Figure 1:
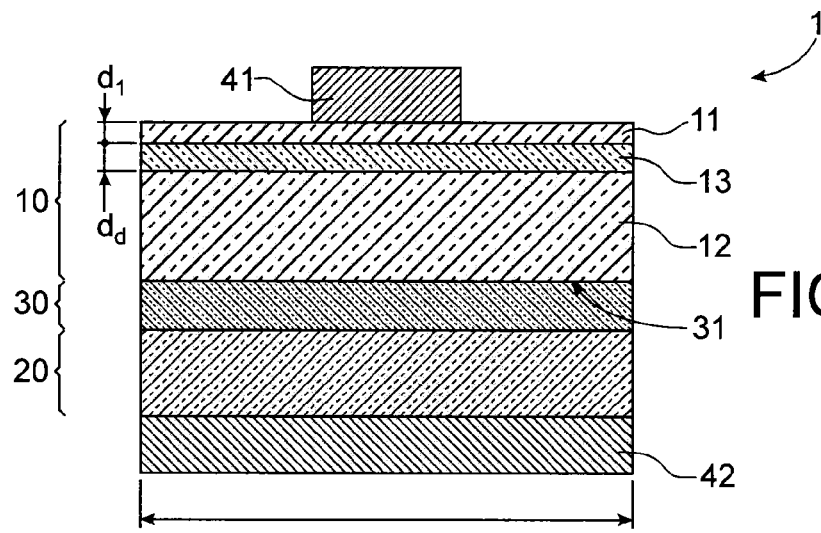
FIG. 1 shows a diagrammatic cross-sectional view of a structure according to the invention.

FIG. 1 shows a cross-sectional view of a structure 1 according to a first embodiment of the invention that is a structure adapted to emit electromagnetic radiation, and more generally light. This first embodiment is the preferred embodiment of the invention.

The structure 1 according to the particular application is a structure adapted to emit electromagnetic radiation for which the range of wavelengths is within range of wavelengths in the visible. Obviously, the invention is not limited to wavelength ranges in the visible, and the principle of the invention can be adapted to any type of semiconducting structure regardless of the wavelength range in which it is intended to emit.

The structure has a nominal operating temperature at which it is intended to function, such a nominal operating temperature being denoted $T_{nf}$. In the particular application, the nominal operating temperature is equal to 100° C.

Such a structure 1 has a first zone 10 and a second zone 20 connected to each other through a third zone 30 to form a semiconducting junction, each being in contact with a corresponding electrical contact 41, 42.

More precisely, such a structure 1 comprises the following, starting from the second electrical contact 42 towards the first electrical contact 41:

the second electrical contact 42, the second semiconducting zone 20 with a first and a second face, the first face being in contact with the second electrical contact 42, the second zone 20 having a second type of conductivity, the third semiconducting zone 30 in contact with the second zone 20 on the second face of the second zone 20, the energy band gap of the third zone 30 being less than the energy band gap of zones 10 and 20, the first semiconducting zone 10 in contact with the third zone 30 on the face of the third zone 30 opposite the second zone 20, the conductivity of the first zone 10 being of a first type opposite the second type of conductivity so as to form a semiconducting junction with the second zone 20 that extends into the third zone 30, the emission surface of the structure 1 being the face of the first zone opposite the third zone 30, the first electrical contact 41 in contact with the first zone 10 on the face of the first zone 10 that is opposite the third zone 30.

According to one advantageous possibility of the invention, at least the first zone 10 and preferably all semiconducting zones 10, 20, 30 of the structure 1 are made from semiconducting materials formed from at least the same three chemical elements adapted such that the variation of the proportion of at least one of these chemical elements induces a variation in the energy band gap of the material comprising said proportion of said chemical element.

According to this advantageous possibility of the invention, the semiconducting elements formed may be a combination of elements selected from columns III and V in the Mendeleiev periodic table such as indium In, gallium Ga, arsenic As, antimony Sb, aluminium Al and nitrogen N, or elements selected in columns II and VI in the Mendeleiev periodic table such as cadmium Cd, tellurium Te, mercury Hg, zinc Zn, oxygen O and selenium Se.

Thus in the particular application, the first, second and third zones are composed of the same three chemical elements, namely gallium Ga, indium In and nitrogen N and are thus formed either from gallium nitride GaN, or gallium-indium nitride $In_xGa_{1-x}N$, where x is a value between 0 and 1.

In the configuration shown in FIG. 1, the second zone 20 comprises an approximately flat semiconducting support. The support is preferably a direct band gap semiconductor. The energy band gap of the second zone 20 is higher than the energy of the electromagnetic radiation emitted by the structure 1.

In the particular application, the second zone 20 has the second type of conductivity that is a type of conductivity in which the majority carriers are holes. According to this particular application, the concentration of majority carriers in the second zone 20 is adapted such that the resistivity of said second zone 20 is 1Ω.cm.

It should be noted that according to one alternative possibility of the invention that is not illustrated, the second zone may include a semiconducting zone with a form other than a flat semiconducting support.

According to one alternative configuration of the invention not shown, the invention may also comprise a support in contact with the second zone. In this configuration, the support is in contact with the second layer on the face of the second zone opposite the third zone. The second electrical contact forms a reflecting layer on the face of the support opposite the second zone.

The first face of the second zone 20 is in contact with the second electrical contact 42.

The second electrical contact 42 is a layer made from a conducting material adapted to inject majority carriers from the second zone 20 into the second zone 20 and to form a resistive type contact with the material forming said second zone. The conducting material forming the second contact 42 is preferably a material adapted to at least partially and preferably almost entirely reflect electromagnetic radiation with a wavelength within the range of wavelengths in which the structure 1 is designed to emit.

The second contact 42 covers almost the entire first face of the second zone 20.

The second face of the second zone 20 is in contact with the third zone 30.

Figure 2:
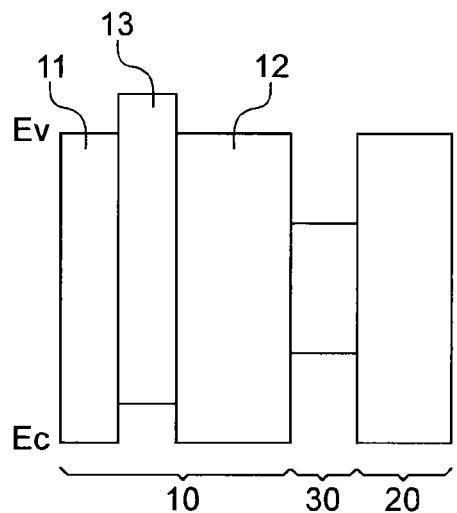
FIG. 2 shows a simplified and diagrammatical band diagram in flat bands according to a first embodiment of the invention.

The third zone 30 is a semiconducting layer made from a semiconducting material usually a direct band gap material for which the energy band gap is adapted to the wavelength of electromagnetic radiation at which the structure 1 is intended to emit. Thus, in order to improve the efficiency of the structure, the energy band gap of the third zone is preferably less than the energy band gap of the first and second zones, as shown in FIG. 2.

It should be noted that the energy band gap of the third zone 30 may be not less than the energy band gap of the first and second zones 10, 30.

The third zone extends in a plane called the third zone plane. The third zone 30 may be a so-called "intrinsic" zone or a so-called "non-intentionally doped" zone.

A non-intentionally doped zone means that the concentration of majority carriers in said zone is the concentration in a material in which no doping elements have been intentionally introduced, in other words elements capable of supplying carriers, and in which the concentration of majority carriers is then said to be non-intentionally doped. The value and type of carriers in a non-intentionally doped type zone are related to the formation process of said zone.

According to one possible feature of the invention not shown, the third zone 30 may comprise one or several carrier confinement systems such as quantum wells, in order to increase the emission efficiency of said structure 1.

In the particular application, the third zone 30 is formed from gallium-indium nitride $In_xGa_{1-x}N$ in which the proportion x of indium In is equal to 15%. According to this same application, the thickness of the third zone 30 is approximately equal to 50 nm. The concentration of carriers in the third zone 30 in the particular application is the concentration of a gallium-indium nitride $In_xGa_{1-x}N$ of the intrinsic or non-intentionally doped type.

The thickness values given above and throughout the remainder of this document are average thickness values, the thicknesses possibly having local variations as a function of fluctuations in manufacturing processes and/or structural constraints.

The third zone 30 is in contact with the first zone 10 on the face of the third zone 30 opposite the second zone 20.

Thus, the third zone 30 connects the first and second zones 10, 20 so as to form a double semiconducting heterojunction. The plane of the third zone 30 forms the junction plane.

The first zone 10 according to the possibility shown in FIG. 1 is in the form of a multi-layer comprising the following, starting from the third zone and working towards the first contact:

a second part 12 in the form of a layer, the first zone 10 being connected to the third zone 30 and therefore to the second zone 20 through the second part 12,
  an intermediate layer 13 called the spreading layer, that is in contact with the second part 12 on the face of the second part 12 opposite the third zone 30,
  a first part 11 in contact with the spreading layer 13 on the face of the spreading layer 13 opposite the second part 12.

The second part 12 of the first zone 10 is a preferably direct band gap semiconducting layer. The second part 12 has a first type of conductivity in which the absolute value of the concentration of majority carriers is higher than in the third zone 30. According to one possibility of the invention, the second part 12 may be made from the same semiconducting material as the second zone 20, the type of conductivity being reversed.

In the particular application, the second part 12 is made from gallium nitride (GaN). In this application, the concentration of majority carriers in the second part 12 is adapted such that the resistivity of the second part 12 is $1\times10^{-2}$Ω.cm and the conductivity of this second part 12 is the type of conductivity for which the majority carriers are electrons.

The second part 12 is in contact with the spreading layer 13.

The spreading layer 13 is a layer made from a preferably direct band gap semiconducting material. The spreading layer 13 has the first type of conductivity. The resistivity of the spreading layer 13 is higher than the resistivity of the first part 11 and preferably higher than the resistivity of the second part 12. The increased resistivity of the spreading layer 13 relative to the first part 11 and preferably the second part 12 may be achieved as shown in FIG. 2, by a lower concentration of majority carriers in the spreading layer 13 than in the first part 11 and preferably lower than in the second part 12. The spreading layer 13 is preferably made from the same material as the second part 12.

As shown in FIGS. 1 and 2, the spreading layer 13 is composed of a single semiconducting material.

The difference in the concentration of majority carriers between the first part 11 and the spreading layer 13 inevitably involves the formation of an energy barrier at the interface between this first part 11 and the spreading layer 13. In the special case shown in FIG. 2, the energy barrier corresponds to a negative energy difference between the conduction bands of the spreading layer 13 and the first part 11.

It is preferable if the concentrations of majority carriers in the first part 11 and the spreading layer 13 are adapted such that the value of the energy barrier is lower than $kT_{np}$, so that this barrier does not significantly limit the circulation of carriers. In other words, carriers transiting from the first part 11 towards the second part 12 are not affected by the barrier as they pass through the spreading layer 13 because thermal agitation is such that they can cross it.

The spreading layer 13 extends approximately parallel to the junction plane over at least most of the junction and preferably over the entire length of the junction, as shown in FIG. 1.

The thickness of the spreading layer 13 is preferably adapted to enable spreading of carriers over the entire length of the junction, the maximum dimension of the structure in the junction plane 31 being 2L. Such an adaptation according to this embodiment is obtained when the thickness of the spreading layer respects the following relation:

$$\frac{\rho_1}{\rho_d} < 100 \frac{d_1 \times d_d}{L^2},$$

where $\rho_1$ and $d_1$ are the resistivity and thickness respectively of the first part 11, $\rho_d$ and $d_d$ are the resistivity and thickness respectively of the spreading layer 13.

Figure 3:
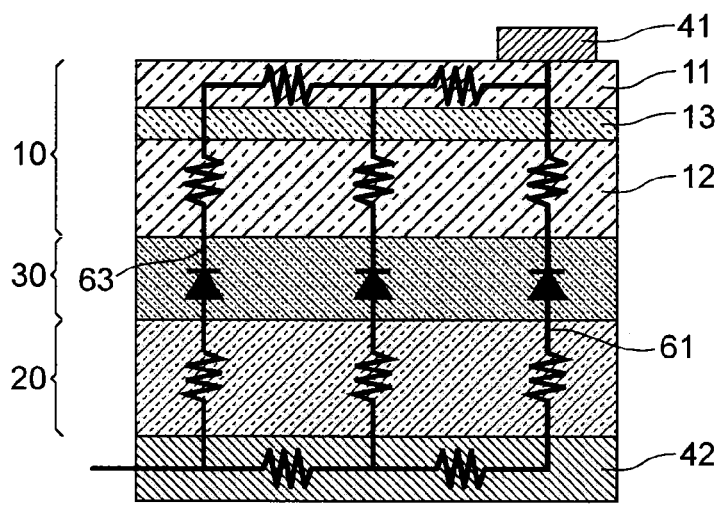
FIG. 3 shows the general operating principle of a structure according to the invention.

The above relation defines the fact that the resistance to a carrier as it transits along the first part along the spreading dimension must be less than the 2 5 resistance to a carrier as it passes through the spreading layer. As shown in FIG. 3, such a difference means that the structure has a minimum difference in resistance between the conducting path 61 of a carrier passing directly from the first contact to the second contact and the conducting path 63 of a carrier transiting firstly along the first part before passing through the different layers 13, 12, 30, 20 forming the structure 1 to join the second contact 42. The result obtained is thus a current distribution over most of the junction, preferably the entire junction and therefore light emission distributed over most of the junction.

The example shown below illustrates practical application of this relation.

Thus, in a light emitting diode with a junction with a diameter of 500 μm (L) in which light emission must occur with a 50 μm diameter central first electrical contact 41, the spreading length would have to be longer than 225 μm (L/2) to uniformly distribute the current over the "junction area".

In such a configuration in which the first zone is 1 μm thick and its resistivity is equal to $1\times10^{-3}$ Ω.cm, the spreading layer could be 0.6 μm thick for a resistivity of 1 Ω.cm or it could be 60 nm thick for a resistivity of 10 Ω.cm.

In the particular application, the spreading layer 13 is made of gallium nitride GaN. The conductivity type of the spreading layer 13 is the type in which majority carriers are electrons. In this same particular application, the concentration of majority carriers is adapted such that the resistivity of the spreading layer is equal to approximately $1\times10^{-1}$ Ω.cm.

Thus, such a spreading layer 13 is adapted to cause spreading of carriers in the first zone 10 along directions within the plane of the spreading layer 13 and gives a uniform distribution of current as it passes in the junction. The spreading layer 13 is in contact with the first part 11 of the first zone 10.

The first part 11 is a semiconducting layer, preferably a direct band gap layer. The first layer 11 is preferably formed from the same material as the second part 12. The first part 11 has the first type of conductivity. The first type 11 has a higher conductivity than the spreading layer 13 and is of the same order of magnitude as the second part 12, preferably approximately equal to the conductivity of the second part 12.

Thus, in the configuration shown in FIG. 2 in which the first and the second part 11, 12 and the spreading layer 13 are made of the same semiconducting material, the spreading layer 13 forms a potential barrier at its interface with the first part 11 for majority carriers of the first zone 10 when these majority carriers pass from the first part 11 to the spreading layer 13. In this configuration, the spreading layer 13 also forms a potential barrier at its interface with the first part 11 for minority carriers of the first zone 10 when these minority carriers pass from the spreading layer 13 to the first part 11.

In the particular application, the first part 11 is formed from gallium nitride GaN. The conductivity type of the first part 11 is the type for which the majority carriers are electrons. In this particular application, the first part 11 comprises a concentration of majority carriers adapted such that the resistivity of the first part 11 is $1\times10^{-4}$ Ω.cm.

The first part 11 is in contact with the first contact 41. The first contact 41 is a conducting material adapted to form a resistive type contact with the first part 11. The first contact 41 is in contact with the first part 11 over a portion of the face of the first part 11 that is opposite the spreading layer 13. The percentage of the area occupied by the portion is at least 20% less than the area of the face of the first part 11.

Such a structure 1 may be formed by the use of a manufacturing method comprising the following steps:

provide a semiconducting support so as to form the second zone 20, said support having the second type of conductivity and comprising a first and a second face, form a third semiconducting layer 30 in contact with the second face of the second zone 20, said third zone 30 being of the intrinsic type or of the non-intentionally doped type, form the second part 12 in contact with the third zone 30 on the face of the third zone 30 opposite the first zone 10, said second part 12 having a conductivity of the first type, form the spreading layer 13 in contact with the second part 12 on the face of the second part 12 opposite the third zone 30, the spreading layer 13 having the first type of conductivity and a higher resistivity than the resistivity of the second part 12, form the first part 11 in contact with the spreading layer 13 on the face of the spreading layer 13 opposite the second part 12, the first part 11 having the first type of conductivity and a concentration of majority carriers of the same order of magnitude as the second part 12, the first part 11 forming the first zone 10 with the spreading layer 13 and the second part 12, form the first contact 41 in contact with the first part 11 on the face of the first part 11 opposite the spreading layer 13, form the second electrical contact 42 in contact with the first face of the second zone 20.

Note that such a manufacturing method has the advantage that in the case in which all layers forming the first zone 10 are formed from the same material, the layers 11, 12, 13 forming the first zone 10 may be formed in a single step by modulating the concentration of doping elements during deposit of said material to form the spreading layer 13. Thus, the first zone 10 can be formed in a single step in the same way as for a light emitting diode according to prior art, using the same equipment used during manufacturing of the structure 1 according to prior art.

Obviously, the order of the steps in the manufacturing method described above is not limitative and is given purely for information, and it would be quite possible that some of these steps could be done earlier or later than in the order described above, without going outside the scope of the invention. For example, the step in which the first contact 41 is formed could be done directly after the step in which the support is produced.

Second Embodiment

Figure 4:
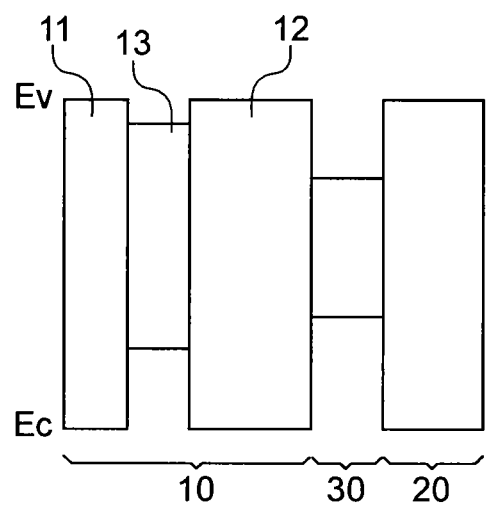
FIG. 4 shows a simplified and diagrammatical band diagram in flat bands according to a second embodiment of the invention.

FIG. 4 diagrammatically shows a band diagram of flat bands of a structure 1 according to a second embodiment of the invention. A structure 1 according to the second embodiment is different from a structure 1 according to the first embodiment in that the spreading layer 13 has a smaller energy band gap than the first and second parts 11, 12 of the first zone 10.

In this embodiment, the spreading layer 13 is made of a semiconducting material with an energy band gap less than that of the semiconducting material forming the first and the second parts 11, 12 of the first zone 10.

In this embodiment, as shown in FIG. 4, the spreading layer 13 is composed of a single semiconducting material.

In the embodiment shown in FIG. 4, the spreading layer 13 forms a potential well between the first and second parts 11, 12. The energy level of the conduction band and the energy level of the valency band of the spreading layer are higher and lower respectively than the levels of the corresponding band in the first and second parts 11, 12.

Thus, the spreading layer 13 forms a potential drop with the first part 11, for carriers in the first zone 10 when they pass from the first part 11 to the spreading layer 13.

Similarly in this configuration, the spreading layer 13 forms a potential barrier at its interface with the second part 12 for carriers in the first zone 10 when these carriers pass from the spreading layer 13 to the second part 12. The spreading layer 13 thus forms a potential well, with the potential drop formed at its interface with the first part 11 and with the potential barrier formed at its interface with the second part 12.

When carriers of the first zone 10 pass from the first part 11 to the spreading layer 13, they lose part of their potential energy that is converted into kinetic energy due to the potential drop, and are partially confined in the spreading layer 13 due to the potential barrier. Carriers in the first zone 10, with this kinetic energy and being partially confined, spread along directions within the plane of the spreading layer thus making it possible to obtain a more uniform distribution of current as it passes into the junction.

The resistivity of the layer 13 is higher than the resistivities of the first and the second parts 11, 12 of the first zone 10.

The concentration of majority carriers in the spreading layer 13 is adapted such that the resistivity of the spreading layer is higher than the resistivities of the first and second parts 11, 12.

A structure 1 according to the particular application disclosed in the first embodiment may be adapted according to the second embodiment. In such an adaptation, the spreading layer 13 is not made from the same material as the material in the first and second parts 11, 12, but is made from gallium-indium nitride $In_xGa_{1-x}N$ with a relative proportion of 5% of indium In. The other characteristics of the structure 1 are identical to those disclosed previously.

The concentration of majority carriers in a spreading layer 13 formed in this way from gallium-indium nitride $In_xGa_{1-x}N$ is lower than that in the first and the second parts 11, 12 of the first zone 10. In the case of first and second parts 11, 12 made from gallium nitride GaN, incorporation of indium In to form the spreading layer 13 can reduce the concentration of the doping element, usually silicon Si, supplying majority carriers.

A manufacturing method of a structure 1 according to this second embodiment is different from a manufacturing method of a structure 1 according to the first embodiment in that the step in which the spreading layer 13 is formed is different.

For a manufacturing process of a structure 1 according to the second embodiment in which the spreading layer 13 is made from a material with a lower energy band gap than that of the first and second parts 11, 12, the material deposited between the step in which the second part 12 is formed and the step in which the spreading layer 13 is formed, has to be modified. Note that for semiconducting materials in which it is possible to modify the energy band gap by changing the proportion of an element, for example as is the case for gallium-indium nitrides $In_xGa_{1-x}N$ and for zinc-manganese oxides $Zn_xMg_{1-x}O$, it is possible to form the spreading layer 13 by modifying the proportion of at least one of the elements so as to obtain the appropriate energy band gap and to modify the concentration of doping elements. After formation of the spreading layer 13, the deposition conditions used for formation of the second part 12 are restored so as to form the first part 11.

Third Embodiment

Figure 5:
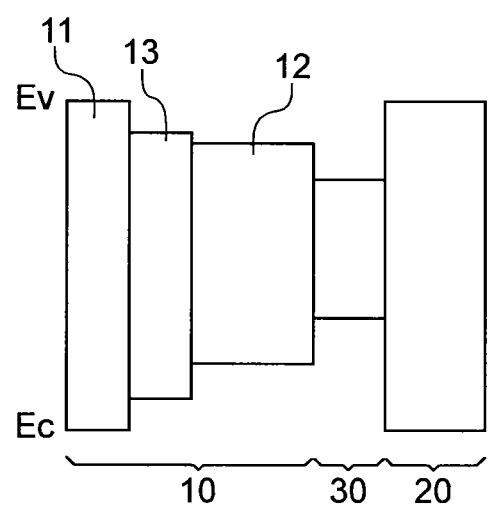
FIG. 5 shows a simplified and diagrammatical band diagram in flat bands according to a third embodiment of the invention.

FIG. 5 diagrammatically illustrates a band diagram in flat bands of a structure 1 according to a third embodiment of the invention. A structure 1 according to the third embodiment is different from a structure 1 according to the second embodiment in that the second part 12 has a smaller energy band gap than the spreading layer 13.

In this third embodiment, the layer forming the second part 12 is made from a semiconducting material, preferably a direct band gap material that has a lower energy band gap than the spreading layer 13.

Such a second part 12, having almost exactly the same conductivity as the first part 11, allows the spreading layer 13 to form a potential drop with the second part for majority carriers of the first zone 10, when these majority carriers pass from the spreading layer 13 to the second part 12.

Thus, in the same way as with a structure 1 according to the second embodiment, with a structure 1 according to the third embodiment, the potential energy of a carrier is partly reduced and converted into kinetic energy as it passes from the first part 11 to the spreading layer 13 and therefore as it passes through the potential drop formed at the interface between the first part 11 and the spreading layer 10. With this kinetic energy, carriers can spread particularly along directions within the plane of the spreading layer 13.

Moreover in this embodiment, since the spreading layer 13 forms a potential drop with the second part 12, carriers also lose part of their potential energy that is converted into kinetic energy as they pass from the spreading layer 13 to the second part 12. Thus, once again with this kinetic energy, carriers can spread particularly along directions within the plane of the spreading layer 13.

The third embodiment is particularly advantageous because there is no energy barrier in zone 10 for the carriers. Consequently, operating voltages of the structure are lower than for a structure according to the previously described embodiments.

As shown in FIG. 5, in this third embodiment the spreading layer 13 is composed of a single semiconducting material. The concentration of majority carriers in the spreading layer 13 is adapted such that the resistivity of the spreading layer 13 is higher than the resistivity of the first and the second parts 11, 12. Similarly, the concentration of majority carriers in the second part 12 is adapted such that the resistivity of the second part 12 of the first zone 10 is lower than the resistivity of the first part 11 of the first zone 10.

Such a third embodiment may be adapted to the particular application described in the first embodiment. In such an adaptation, the spreading layer 13 is made according to the adaptation already described for the second embodiment while the first part 11 is made from gallium-indium nitride $In_xGa_{1-x}N$ in which the relative proportion of indium In is equal to 10%. According to this adaptation, the conductivity type and the resistivity of the first part 11 remain approximately the same as for the adaptation described for the second embodiment.

The concentration of majority carriers in a spreading layer 13 thus formed from gallium-indium nitride $In_xGa_{1-x}N$ is less than that for the first and the second parts 11, 12 of the first zone 10. Incorporation of indium In to form the spreading layer 13 reduces the concentration of the doping element, for example silicon Si in the case in which one of the first and second parts 11, 12 is made from gallium nitride GaN, supplying the majority carriers.

A manufacturing method of a structure 1 according to this third embodiment is different from a manufacturing method of a structure according to the second embodiment in that the step in which the second part 12 of the first zone 10 is formed is different.

For a method of manufacturing a structure 1 according to the third embodiment, since the second part 12 is made from a material with a lower energy band gap than that of the first part 11 and the spreading layer 13, the deposited material has to be modified during the passage from the second part 12 to the spreading layer 13 and during the passage from the spreading layer 13 to the first part 11, according to a principle similar to the manufacturing method of a structure 1 according to the second embodiment. Thus, a manufacturing method of a structure 1 according to this third embodiment is different from a manufacturing method of a structure 1 according to the second embodiment in that during the passage from the spreading layer 13 to the first part 11, the deposition conditions are not restored to the conditions for deposition of the second part 12 but are adapted to deposit a material with a wider band gap than those of the spreading layer 13 and the second part 12.

In all the embodiments disclosed in this document, all the structures 1 are light emitting diodes of the same type, namely a Vertical Thin Film Diode (VTF LED). Nevertheless, the principle of the invention can be applied to any other type of light emitting diode. Thus, without going outside the scope of the invention, a spreading layer could equally well be formed in a Conventional Chip Diode (CC LED), a Flip Chip diode (FC LED) or for example a Thin Film Flip Chip diode (TFFC LED).

Although the spreading layer 13 forms heterojunctions with the first and second parts of the first zone in the second and third embodiments described above, so as to form a potential drop or barrier with these heterojunctions, for majority carriers of the first zone, it would also be possible to form such a potential drop or barrier with a homojunction without going outside the scope of the invention. In the case in which the first and second parts of the first zone and the spreading layer are made from the same material, a concentration of doping elements adapted in the spreading layer 13 can be used to form a potential drop or barrier for majority carriers of the first zone 10.

Fourth Embodiment

Figure 6:
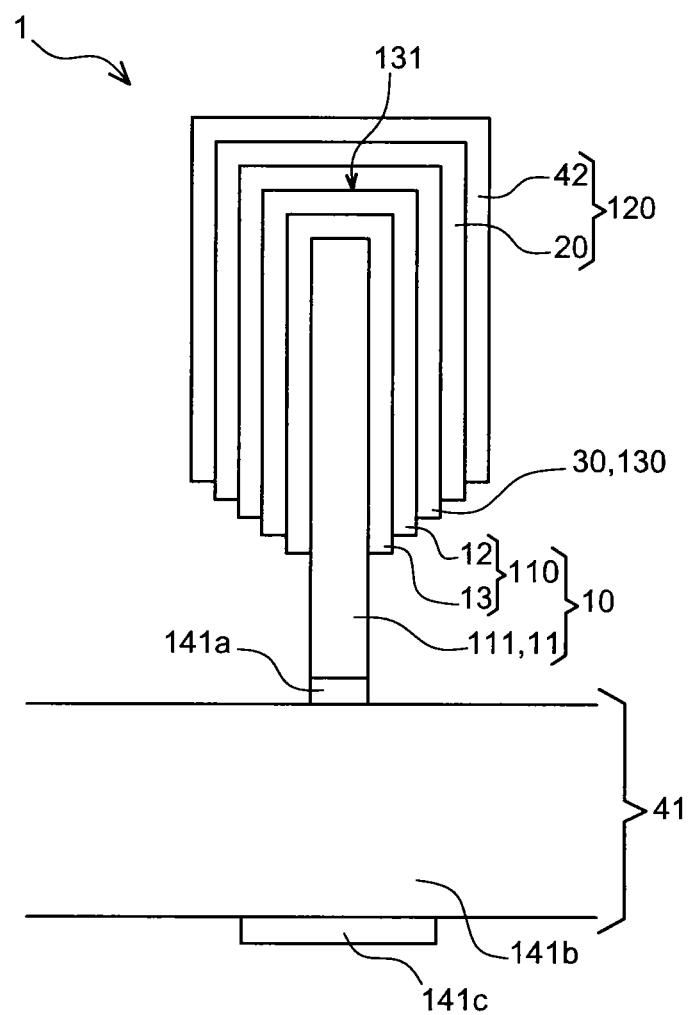
FIG. 6 shows a particular embodiment of the invention in which the structure according to the invention is a semiconducting wire with a core-shell type configuration.

FIG. 6 shows a structure according to a fourth embodiment. Such a structure is different from a structure according to the first embodiment in that the structure 1 is a semiconducting wire with a core shell configuration in which the junction plane is approximately in the form of an envelope separating an elongated wire core 111 and a shell 120, called the outer shell, surrounding the wire core 111 at one of its ends and over at least part of its height.

Throughout this document, wires, nanowires or semiconducting microwires refers to semiconducting structures with three dimensions elongated in shape, in which two of the dimensions are of the same order of magnitude between 5 nm and 2.5 μm, the third dimension being equal to at least twice, 5 times or preferably 10 times more than the other two dimensions.

In this fourth embodiment, since the structure 1 is a semiconducting wire with a core-shell type configuration, all of the layers, zones and parts of the zone forming the structure 1, apart from the first part of the first zone 10 that forms the wire core 111, has an approximately shell shape. As shown in FIG. 6, such a shell shape is a hollow cylindrical form housing the layer, zone or part of zone directly below it. With such a shape, the thickness of a layer, zone or part of a zone means the dimension of the layer, zone or part of a zone along a direction perpendicular to the longitudinal axis of the wire core 111, this dimension possibly being variable as a function of the position relative to the measurement position along the structure.

Thus, in this fourth embodiment, the first part 11 of the first zone 10 forms the wire body 111 while the spreading layer 13, the second part 12 of the first zone 10 form a first intermediate shell 110, the third zone 30 forms a second intermediate shell 130 and the second zone 20 with the second contact 42 forms an outer shell 120. Such a configuration in which the different parts and zones surround each other successively can be defined as a nested type configuration.

As a reminder, the term "nested" usually and as used throughout this document, means "composed of several elements with a similar shape and decreasing size that can be fitted into each other".

The first electrical contact 41 comprises:
a preferably semiconducting support 141b with a first and a second face,
a metallic contact pad 141c located on the first face of the support,
a nucleation pad 141a in contact with the support on its second face, the nucleation pad 141a forming an interface between the wire core 111 and the support 141b.

Such a configuration of the first electrical contact 41 in this fourth embodiment is adapted more particularly for the particular application in which the first part of the first zone is made from gallium nitride. It should be noted that it is also possible that the wire core 111 and the support 141*b* are directly in contact, or that a buffer layer is provided to form the interface between the nucleation pad 141*a*/wire core 111 and the support 141*b*, without going outside the scope of the invention.

The wire core 111 extends longitudinally from the nucleation pad 141*a* along a direction approximately perpendicular to the second face of the support 141*b*. The section of the wire core 111 in the plane of the second face of the support may be in the shape of a disk, a square, or elliptical or polygonal, for example hexagonal, or other any arbitrary shape. Similarly, if the section of the wire core 111 in the plane of the second face is preferably approximately constant along the wire core 111, this latter section may also have a monotonous variation or another type of variation without going outside the scope of the invention.

In the particular application, the section of the wire core 111 in the plane of the second face of the support is preferably hexagonal.

In the particular application of the invention to this fourth embodiment, the wire core 111 may be made from gallium nitride GaN with a type of conductivity in which the majority carriers are electrons. The concentration of majority carriers in the wire core 111 is adapted to have a resistivity of between $1 \times 10^{-4}$ and $1 \times 10^{-2}$ $\Omega$.cm and preferably of the order of $1 \times 10^{-3}$ $\Omega$.cm.

The wire core 111 is in contact with the spreading layer 13 at its end opposite the support 141*b* and around at least part of its periphery. Thus, the spreading layer 13 surrounds the wire core 111 at its end opposite the support 141*b* and over at least part of its height.

The second part 12 of the first zone surrounds the spreading layer 13 over the face of the spreading layer opposite the wire core 111, at the end of the wire core 111 that is opposite the support 141*b* so as to at least partly cover the height of the spreading layer 13 on which it covers the wire core 111.

The spreading layer 13, the second part 12 of the first zone 10 form a first intermediate shell 110 that surrounds the wire core 111 at its end opposite the support 141*b* over at least part of its height.

This same intermediate first shell 110 is in contact with the third zone 30 at the end of the wire core 111 opposite the support 141*b*, over at least part of the height of the first shell 110 on which it is in contact with the wire core 111.

The third zone 30 forming the second intermediate shell 130 may have a configuration similar to that already described for the first embodiment. Thus, the third zone 30 of a structure 1 according to this fourth embodiment may comprise one or several carrier confinement systems, such as a single quantum well, multiple quantum wells that may or may not form a super-network.

The third zone 30 itself is in contact with the second zone 20, at the end of the wire core 111 and at least for part of the height over which it covers the first intermediate shell 110.

The second zone 20 is in contact with the second contact 42, at the end of the wire core 111 opposite the support 141*b*, for at least part of the height of the second zone 20 on which it is in contact with the third zone 30.

The second contact 42 is preferably formed from a conducting material that is partially transparent to the wavelength at which the structure 1 is designed to emit, and even more preferably is completely transparent to this wavelength. Thus, according to this latter characteristic, the second contact 42 may for example be a transparent conducting oxide such as indium-tin oxide (ITO) or a thin metal preferably thinner than the thickness of the skin of this metal.

The method of manufacturing a structure 1 according to this fourth embodiment includes the following steps:

provide a semiconducting support 141*b*, form a nucleation pad 141*a*, form the contact pad 141*c* in contact with the semiconducting support 141*b* on a face of this semiconducting support opposite the nucleation pad, so as to form the first contact 41 with the semiconducting support 141*b* and the nucleation pad 141*a*, form the wire core 111 in contact with the nucleation pad 141a, so as to form the first part 11 of the first zone 10, form the first shell 110 in contact with the wire core 111 forming the spreading layer 13 and the second part of the first zone 10 in contact with the wire core 111, so as to form the first zone 10, form the second intermediate shell 130 in contact with the first intermediate shell 110, while forming the third zone 30, form the outer shell 120 in contact with the second intermediate shell 130, while forming the second zone 20 and the second contact 42.

Obviously, in the same way as for the previous manufacturing methods, the order of the steps is only given for guidance and is in no way limitative. For example, the step in which the contact pad 141*c* is formed can be done after the step in which the outer shell 120 is formed, without going outside the scope of the invention.

According to another possibility of this fourth embodiment not shown, the semiconducting wire may have a core-shell configuration in which the outer shell 120 surrounds the wire core 111 only over part of its height without the outer shell 120 surrounding one of the ends of the wire core 111. According to this other possibility of the fourth embodiment, each of the layers, zones and zone parts that make up the structure 1, apart from the first part of the first zone 10 that forms the wire core 111, has an approximately tubular shape surrounding the layer, zone or zone part directly below it in the direction of the wire core over part of the height of the wire core, the ends of the wire core 111 remaining free.

A structure 1 according to this fourth embodiment is particularly suitable for being integrated and repeated in a semiconducting component 200.

Figure 7A:
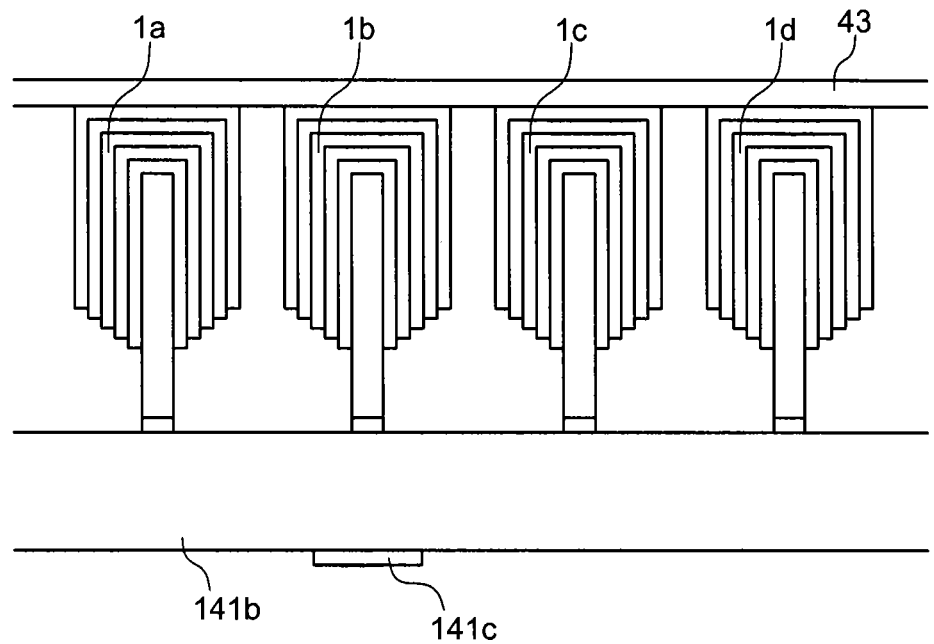
FIGS. 7A and 7B show a semiconducting component according to the invention with a plurality of structures shown in FIG. 6 and a diagrammatic block diagram showing the operating principle of such a component, respectively.

FIG. 7A thus illustrates such a semiconducting component 200 in which four structures 1*a*, 1*b*, 1*c*, 1*d* according to the fourth embodiment have been integrated. In such a semiconducting component 200, the wires 1*a*, 1*b*, 1*c*, 1*d* equip a semiconducting support 141*b* forming a first common electrical contact with the nucleation pads 141*a* of wires 1*a*, 1*b*, 1*c*, 1*d*.

Wires 1*a*, 1*b*, 1*c*, 1*d* are distributed along the surface of the support, either in an ordered manner as is the case shown in 7A according to a preferred embodiment of the invention, or at random. The characteristics of each of the wires 1*a*, 1*b*,1*c*, 1*d* installed on such a component are identical to the characteristics described above in this fourth embodiment.

According to a first possibility of the invention, in such a component, the second contact 42 of each of the wires may be connected to a common electrode 43 such that the wires 1*a*, 1*b*, 1*c*, 1*d* are put into parallel. As shown in figure 7A, the common electrode 43 includes a layer extending in contact with the end of the wires 1*a*, 1*b*, 1*c*, 1*d* that is opposite the support 141*b* approximately parallel to the second face of the support 141*b*. In this manner, the common electrode 43 is in electrical contact with each of the wires 1*a*, 1*b*, 1*c*, 1*d*.

The common electrode 43 is configured to allow electromagnetic radiation emitted by the wires 1*a*, 1*b*, 1*c*, 1*d* to pass, for example by forming this electrode in a material at least partially transparent to the wavelength(s) at which the wires 1*a*, 1*b*, 1*c*, 1*d*, are designed to emit. Such a material that is at least partially transparent may for example be a transparent conducting oxide (known under as TCO) such as indium-tin oxide, or a thin metal layer adapted to allow most of the emitted radiation to pass through.

Figure 7B:
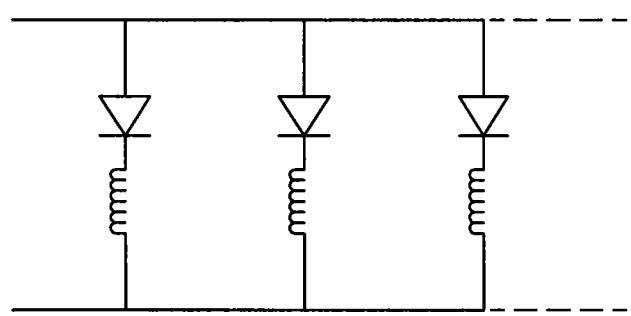

In a semiconducting component 200 according to this first possibility, in addition to improving the current distribution at the junction of each of the wires 1*a*, 1*b*, 1*c*, 1*d*, the spreading layer can improve the distribution of current between wires 1*a*, 1*b*, 1*c*, 1*d*. As shown in the block diagram in figure 7B, the spreading layer 13 adds an additional resistance to each of the wires 1*a*, 1*b*, 1*c*, 1*d*, the value of which is directly related to the thickness and the layout of the spreading layer 13. Thus, since the resistance provided by the spreading layer 13 is relatively uniform, a relatively uniform value of the impedance of wires 1*a*, 1*b*, 1*c*, 1*d* is obtained and therefore the current is well distributed between these wires 1*a*, 1*b*, 1*c*, 1*d*.

Such a first possibility is particularly advantageous to produce a semiconducting component with structures designed to produce lighting with a high illumination power.

It should be noted that a method of manufacturing a semiconducting component 200 according to this possibility has the same structure manufacturing steps according to this fourth embodiment, the latter steps being done in parallel over the entire area in order to form a plurality of structures, followed by an additional step to produce the common electrode 43.

According to a second possibility of the invention not shown, the wires 1*a*, 1*b*, 1*c*, 1*d* may be connected independently of each other so as to control their emission individually. In the same way as for the first possibility disclosed below, the spreading layer 13 can be used to homogenise the impedance of wires 1*a*, 1*b*, 1*c*, 1*d* and therefore the light intensity emitted by each wire 1*a*, 1*b*, 1*c*, 1*d* for a given polarisation.

A semiconducting component 200 according to this second possibility is particularly suitable to produce a display surface such as a screen.

Obviously, although a structure 1 according to this fourth embodiment is described with a configuration of the first zone 10 that is common with the structure 1 according to the first embodiment, the structure 1 according to this fourth embodiment could also have a configuration of the first zone 10 according to either the second or third embodiment without going outside the scope of the invention.

The different structures disclosed above through these four embodiments are only given as examples of the possibilities of the invention and they are not limitative. The invention covers all light emitting semiconducting structures with a spreading layer in one of the two zones forming an emitting junction, adapted to spread carriers along directions within the plane of the spreading layer, for example forming a local increase in the resistivity and/or a drop of potential in said zone, for at least one type of carrier, preferably the type of the majority carriers in said zone.

Similarly, although each of the structures 1 according to the embodiments of the invention disclosed above comprises a first zone 10 in which each of the first and the second parts 11, 12 and the spreading layer 13 have an approximately constant composition of semiconducting materials and a concentration of majority carriers over the entirety of said parts 11, 12 or the spreading layer 13, it is also possible that this composition and/or concentration could be varied over at least a portion of at least one of the first and second parts 11, 12 and the spreading layer 13, without going outside the scope of the invention. Thus, without going outside the scope of the invention, a structure 1 according to the invention may for example comprise at least a portion of the first and second parts 11, 12 and the spreading layer 13 that comprises a graduated composition of semiconducting materials and/or a concentration of majority carriers so that one of the interfaces between the first part 11 and the spreading layer 13 and between the spreading layer 13 and the second part 12 is a gradual rather than a step interface.

The invention claimed is:

1. A semiconducting structure configured to emit electromagnetic radiation, the structure comprising:
    a first zone with a first type of conductivity and a second zone with a second type of conductivity respectively opposite to each other, the first and second zones being connected to each other to form a semiconducting junction, the junction extending along a junction plane,
    wherein the first zone comprises at least a first part and a second part, such that the second part is a part through which the first zone is connected to the second zone,
    the first part and the second part being separated from each other by an intermediate spreading layer, extending approximately parallel to the junction plane along a major part of the junction, the spreading layer being configured to cause spreading of carriers along directions included in a plane of the spreading layer,
    wherein the spreading layer has a higher resistivity than the first part of the first zone over an entire thickness of the spreading layer,
    wherein the spreading layer is formed of a single semiconducting material, and
    wherein the first part of the first zone is a layer approximately parallel to the junction plane, the first part having a resistivity $\rho_1$ and a thickness $d_1$, the spreading layer having a resistivity $\rho_d$ and a thickness $d_d$, and the junction having a maximum dimension 2L in the junction plane, the thicknesses and resistivities of the first part of the first zone and the spreading layer respectively respecting the following relation:

$$\frac{\rho_1}{\rho_d} < 100 \frac{d_1 \times d_d}{L^2}.$$

2. The structure according to claim 1, wherein the spreading layer is configured to work with the first part to form a potential drop for majority carriers of the first zone when the majority carriers pass from the first part to the spreading layer.

3. The structure according to claim 1, wherein the spreading layer is configured to form a potential drop with the second part for majority carriers of the first zone when the majority carriers pass from the spreading layer to the second part.

4. The structure according to claim 1, wherein the spreading layer, with the second part, is configured to form a potential barrier for majority carriers of the first zone when the majority carriers pass from the spreading layer to the second part.

5. The structure according to claim 2, wherein the spreading layer is configured to form a potential well, for majority carriers of the first zone, between the first part and the second part of the first zone.

6. The structure according to claim 2, wherein the first zone is formed of at least three chemical elements of which a proportion of at least one of the elements is configured to vary an energy band gap of a semiconducting material formed from the elements, the spreading layer having an average proportion of at least one of the elements different from an average proportion of at least the first part such that an energy band gap of the spreading layer is less than an energy band gap of the first part.

7. The structure according to claim 1, wherein the first part and the second part of the first zone and the spreading layer are made from a same material.

8. The structure according to claim 1, wherein the structure is a planar type structure, and a shape of the junction plane is approximately plane.

9. The structure according to claim 1, wherein the structure is a semiconducting wire with a core-shell type configuration, the junction plane being approximately in a form of an envelope separating an elongated wire core and an outer shell surrounding the wire core over at least part a height of the wire core.

10. The structure according to claim 9, wherein the wire core forms the first part of the first zone and in which each of the spreading layer, the second part of the first zone, a third zone, and the second zone is in a form of a shell in a nested type configuration.

11. A semiconducting component comprising a plurality of semiconducting wires each configured to emit electromagnetic radiation, wherein at least two semiconducting wires are semiconducting wires according to claim 9.

12. A method of manufacturing a semiconducting structure configured to emit electromagnetic radiation, the method comprising:
    forming a first part of a first zone with a first type of conductivity;
    forming a spreading layer in contact with the first part of the first zone on a face of the first zone, the spreading layer being composed of a single semiconducting material and having a resistivity higher than a resistivity of the first part of the first zone;
    forming a second part of the first zone in contact with the spreading layer on a face of the spreading layer opposite the first part of the first zone, the second part of the first zone having a resistivity lower than a resistivity of the spreading layer; and
    forming a second zone of the structure, the second zone of the structure having a second type of conductivity respectively opposite to the first type of conductivity and being connected to the first zone in such a way as to form a semiconducting junction, the junction extending along a junction plane, the first part of the first zone being a layer approximately parallel to the junction plane,
    wherein the first part of the first zone has a resistivity $\rho_1$ and a thickness $d_1$, the spreading layer has a resistivity $\rho_d$ and a thickness $d_d$, and the junction has a maximum dimension 2L in the junction plane, the thicknesses and resistivities of the first part of the first zone and the spreading layer respectively respecting the following relation:

$$\frac{\rho_1}{\rho_d} < 100 \frac{d_1 \times d_d}{L^2}.$$

13. The method according to claim 12, wherein the first zone is a multi-layer with a first and a second layer forming the first and the second parts respectively, each of the steps of forming the first and the second parts including depositing a semiconducting material to form a layer of the semiconductor material.

14. The method according to claim 12, wherein the first and the second parts and the spreading layer are formed in a single step of depositing a semiconducting material comprising at least one type of doping elements to produce carriers corresponding to the first type of conductivity, a concentration of at least one of the doping elements being varied during the depositing to form the spreading layer.

15. The method according to claim 14, wherein the first part and the second part of the first zone and the spreading layer are formed from semiconducting materials with a different energy band gap for at least the first part and the spreading layer, forming the first and second parts and the spreading layer taking place in a single step of depositing chemical elements, forming a semiconducting material, a composition of which is varied during the deposition to form the second part, the spreading layer, and the first part in sequence.

16. The method according to claim 12, wherein the forming the first part of the first zone produces a wire core, the forming the spreading layer, the second part, and the second zone, forming layers each of which has an approximately shell shape.

17. The method according to claim 13, further comprising performing said each of the steps in parallel to form a plurality of structures.

* * * * *